(12) United States Patent
Rothenberg et al.

(10) Patent No.: US 7,466,731 B2
(45) Date of Patent: Dec. 16, 2008

(54) HIGH EFFICIENCY, HIGH POWER CRYOGENIC LASER SYSTEM

(75) Inventors: Joshua Elliott Rothenberg, Los Angeles, CA (US); Stephen John Brosnan, San Pedro, CA (US); Paul Thomas Epp, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 143 days.

(21) Appl. No.: 11/361,347

(22) Filed: Feb. 24, 2006

(65) Prior Publication Data

US 2007/0201518 A1 Aug. 30, 2007

(51) Int. Cl.
*H01S 3/04* (2006.01)
(52) U.S. Cl. ............................................. 372/34; 372/6
(58) Field of Classification Search .................. 250/343; 359/341.1, 334; 372/36, 35, 34; 62/259.2
See application file for complete search history.

(56) References Cited

U.S. PATENT DOCUMENTS

| 6,195,372 | B1 | 2/2001 | Brown | |
|---|---|---|---|---|
| 6,760,351 | B1 | 7/2004 | Riley et al. | |
| 6,804,287 | B2 * | 10/2004 | Backus et al. | 372/70 |
| 2003/0030892 | A1 * | 2/2003 | Dennis et al. | 359/341.1 |
| 2005/0243407 | A1 * | 11/2005 | Dennis et al. | 359/334 |

OTHER PUBLICATIONS

E. Desurvire et al., "Evaluation of . . . Stark-level energies in erbium-doped aluminosilicated glass fibers," Optics Lett., vol. 15, No. 10, pp. 547-549, May 15, 1990.

D.Y. Shen et al., "High-Power and Ultra-Efficient Operation of a Tm-doped Silica Fiber Laser," Advanced Solid-State Photonics, paper MC6, Vienna (2005).

Gavin Frith et al., "High Power 2um Tm-Doped Fibre Lasers," Proc. of SPIE vol. 5620, pp. 36-45, 2004.

Makoto Shimizu et al., "Gain characteristics of erbium-doped . . . fiber amplifiers operated at liquid-nitrogen temp.," Appl. Phys. Lett. 56 (23), pp. 2273-2275, Jun. 4, 1990.

Cheng Li et al., "Diode-pumped high-efficiency Tm:YAG lasers," OSA Optics Express, vol. 4, No. 1 pp. 12-18, Jan. 4, 1999.

P. Peterson et al., "Temperature dependent cross relaxation effects in Tm:YAG lasers," Proc. of CLEO Europe '94, paper CFC6, p. 391 (1994).

W.L. Barnes et al., "Highly tunable and efficient diode pumped operation of Tm doped fibre lasers," Electronics Lett., vol. 26, No. 11, p. 746-47, May 24, 1990.

Jay Brasseur et al., "Diode Pumped Oxeygen and Oxygen Iodine Lasers," JTO Ann. Review (2005).

* cited by examiner

*Primary Examiner*—Minsun Harvey
*Assistant Examiner*—Tuan N. Nguyen
(74) *Attorney, Agent, or Firm*—Tarolli, Sundheim, Covell & Tummino LLP

(57) ABSTRACT

A fiber laser system and a related method for its use, in which one or more fiber laser amplifiers are cryogenically cooled and optimized to operate at a desirably high efficiency. Versions of the laser system using either thulium or erbium doped fibers are disclosed. In a high power version of the system, the outputs of multiple fiber lasers are coherently combined. Cooling by a selected liquefied gas, such as nitrogen, is applied to the fiber laser amplifiers and, optionally, to pump diodes and to optical elements used to combine the outputs of the fiber laser amplifiers.

15 Claims, 2 Drawing Sheets

HIGH EFFICIENCY, HIGH POWER CRYOGENIC LASER SYSTEM

BACKGROUND OF THE INVENTION

This invention relates generally to high power lasers and, more particularly, to techniques for achieving high power and high efficiency in fiber lasers. Achieving high efficiency in fiber lasers has long been a goal for designers of high power laser systems employing fiber lasers. A convenient measure of efficiency is optical-to-optical slope efficiency, which is the slope of a characteristic curve plotting optical output power against optical input pump power. This curve is basically a straight line once the pump power reaches a threshold value at which lasing begins. It is known that an ytterbium (Yb) doped fiber laser pumped at 975 nm wavelength can operate at slope efficiency of approximately 80% for an output wavelength near 1080 nm. Unfortunately, achieving efficiencies this high is much more difficult for wavelengths in the "eye-safe" region above 1.3 µm. For example, an erbium: ytterbium (Er:Yb) codoped fiber laser has achieved a slope efficiency of only about 40%, limited by the pump/signal wavelength ratio of 975 nm/1550 nm (63%).

A published report has indicated more promising results for a thulium (Tm) fiber laser pumped at 790 nm, amplifying at 2000 nm wavelength, and achieving slope efficiencies grater than 50%. For the Tm fiber laser, it is possible to exceed the nominal pump/signal quantum ratio of 790 nm/2000 nm (40%) because of a known "2 for 1" Tm cross-relaxation mechanism, which promotes two Tm energy level sites to the upper laser state manifold for a single absorbed pump photon, and thereby doubles the potential laser efficiency. In addition, it has been observed that the Tm silica fiber laser efficiency is strongly dependent on the fiber temperature and, more specifically, that the Tm fiber laser slope efficiency increases from 40% to 52% when the coolant temperature is lowered by only approximately 10° C.

In spite of these promising findings reported in the technical literature, no-one prior to the present invention has produced a high power fiber laser system with efficiencies well above those reported, and preferably capable of operation at eye-safe wavelengths. The present invention achieves this goal and has additional benefits and advantages.

SUMMARY OF THE INVENTION

The present invention resides in a high power, high efficiency cryogenic fiber laser system. In the context of the invention, the term "cryogenic" is used, unless otherwise defined herein, with its common dictionary meaning. The *Merriam-Webster OnLine* dictionary defines "cryogenic" as "of or pertaining to the production of very low temperatures" or "being or relating to very low temperatures." Cryogenic temperatures are typically produced by exposure to, ore thermal contact with, a liquefied gas, such as nitrogen, which has a boiling point of approximately −196° C. However, other liquefied gases, with higher or lower boiling points than nitrogen, may be used in appropriate designs to produce temperatures low enough to raise the efficiency of the laser system to a desired level.

Briefly, and in general terms, the high power cryogenic fiber laser system of the invention comprises at least one fiber laser amplifier; means for coupling an input optical signal to the fiber laser amplifier; optical pump means for coupling power into the fiber laser amplifier; and means for cryogenically cooling the fiber laser amplifier, resulting in enhanced optical slope efficiency. In one embodiment of the invention, the fiber laser amplifier comprises a thulium doped fiber; and the laser system produces output at an eye-safe wavelength, with a slope efficiency of at least approximately 80%. In another embodiment, the fiber laser amplifier comprises an erbium doped fiber; and the laser system produces output with a slope efficiency of approximately 90%.

The invention may also be defined as a high power cryogenic fiber laser system capable of operation at high efficiency levels, the system comprising a plurality of fiber laser amplifiers; a master oscillator for generating an input optical signal at a desired wavelength; means for coupling the input optical signal to the plurality of fiber laser amplifiers; a plurality of laser pump diodes; means for coupling power from the laser pump diodes into the plurality of fiber laser amplifiers; means for cryogenically cooling the plurality of fiber laser amplifiers, resulting in enhanced optical slope efficiency; and means for optically combining the outputs of the plurality of fiber laser amplifiers, to produce a single coherent optical output.

The multiple fiber laser system may also include means for cryogenically cooling the plurality of laser pump diodes and means for cryogenically cooling the means for optically combining the outputs of the plurality of fiber laser amplifiers. The various means for cryogenically cooling may comprise a cryogenic vessel containing liquid nitrogen, or containing some other liquefied gas, such as methane or ammonia.

The invention may also be defined as a method for generating a high power laser beam from a cryogenic fiber laser system capable of operation at high efficiency levels, the method comprising the steps of providing a plurality of fiber laser amplifiers; generating in a master oscillator an input optical signal at a desired wavelength; coupling the input optical signal to the plurality of fiber laser amplifiers; powering a plurality of laser pump diodes; coupling power from the laser pump diodes into the plurality of fiber laser amplifiers; cryogenically cooling the plurality of fiber laser amplifiers, resulting in enhanced optical slope efficiency; and optically combining the outputs of the plurality of fiber laser amplifiers, to produce a single coherent optical output. The method may also comprise cryogenically cooling other components of the fiber laser system, such as the pump diodes and optical components used in the step of optically combining the outputs of the fiber laser amplifiers.

It will be appreciated from the foregoing summary that the present invention represents a significant advance in the field of high power fiber laser systems. In particular, the invention provides a technique for combining multiple fiber lasers in a manner that yields a composite output at very high efficiencies. Other aspects and advantages of the invention will become apparent from the following more detailed description, taken in conjunction with the accompanying drawings.

DETAILED DESCRIPTION OF THE INVENTION

Figure 1:
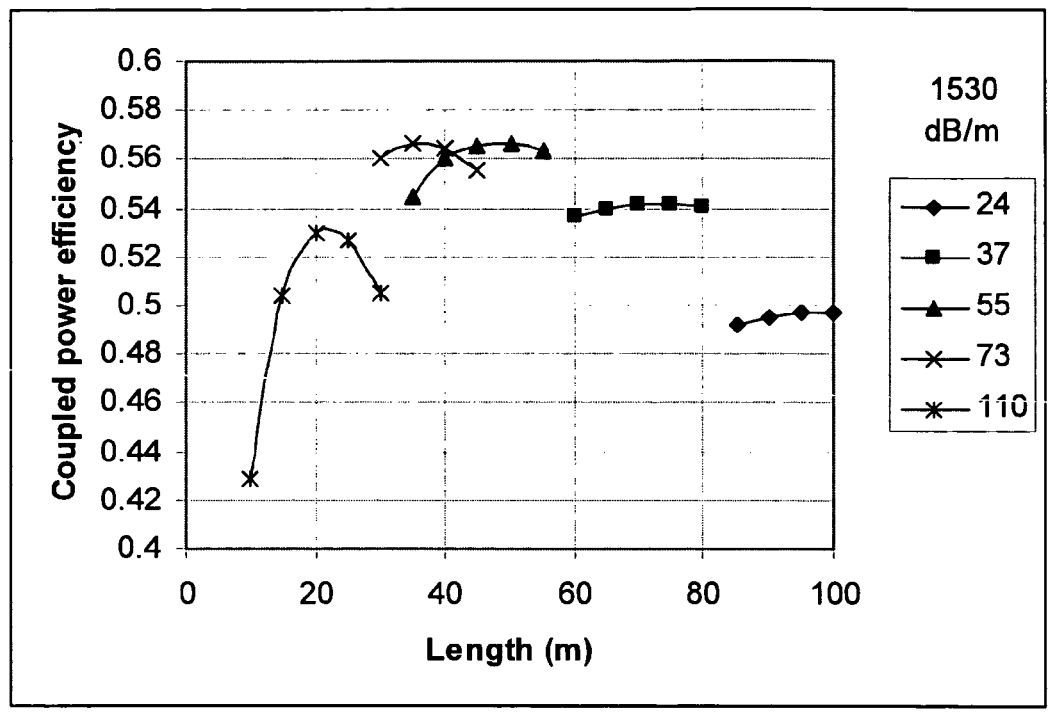
FIG. 1 is a group of graphs showing the coupled power efficiency at room temperature of erbium doped fiber lasers with various doping levels, versus fiber length, and also showing how the length of each doped fiber can be optimized to provide a maximum efficiency for each doping level.

As shown in the drawings for purposes of illustration, the present invention is concerned with a high power, high efficiency cryogenic fiber laser system. As is well known, output beams from multiple fiber lasers may be combined to produce a single coherent beam of high power, which has both commercial and military applications. As is also well known, fiber lasers function as amplifiers when pumped with optical energy launched into each fiber laser. Unfortunately, fiber lasers produced or proposed prior to this invention do not achieve desirably high levels of efficiency, which may be measured, for example, by the ratio of the output optical power to the input pump power. A useful measure in this regard is the slope efficiency, which is the slope of a characteristic curve plotting the output power to the input pump power. This is due to the fact that each laser has a threshold pump power below which no lasing occurs, such that the slope efficiency at some point on the curve is slightly higher than the absolute ratio of output to input power measured at the same point on the curve. Ideally, slope efficiencies of 80% or more are desired. Higher efficiencies result not just in a lower consumption of energy for a given output power, but also in an overall laser system that is more compact and has lower weight.

In accordance with the present invention, a fiber laser system is cryogenically cooled to provide very high efficiencies. In one specific embodiment of the invention, a thulium fiber laser system is cryogenically cooled to provide slope efficiencies of approximately 80%. Previous experiments have demonstrated that the optimum lasing wavelength decreases noticeably with a modest temperature decrease around ambient. With proper design, laser oscillation in Tm fiber reach wavelengths as short as 1650 nm at room temperature. Highly transparent atmospheric transmission windows open up for wavelengths shorter than about 1700-1750 nm. Therefore, with the multiple benefits of cryogenic operation in the Tm fiber laser, an eye-safe laser with excellent atmospheric transmission and very high efficiency can be achieved using a cryogenically cooled Tm fiber laser. It should be noted that the theoretical quantum limited slope efficiency for a Tm laser operating at 1700 nm with complete 2-for-1 pumping at 790 nm is approximately 93%. This is similar to the quantum limit for the Yb fiber laser, and thus a goal of 80% slope efficiency for such a Tm fiber eye-safe laser should be easily attainable.

A further advantage of such a Tm cryogenic fiber laser is the potential improvement in diode pump electrical conversion efficiency. It is estimated that the electrical-optical efficiency of such a low temperature eye-safe fiber laser exceeds 50%. For example, if one assumes 75% diode efficiency, 90% efficiency coupling the diodes into the fiber, and 80% fiber laser (slope) efficiency, then the electrical to optical conversion efficiency of the entire fiber laser system would be 54% (given by the product of 75%, 90% and 80%). If liquid nitrogen (LN2) is used to cool such a laser system, the large heat of vaporization of LN2 (200 kJ/kg) is attractive for the thermal management of the laser system, using a finite magazine. For example, at 50% system efficiency, the heat dissipated by a 100 kW laser with a 100-second magazine is 10 MJ, which would vaporize only 50 kg of LN2. In other words, only 0.5 kg (about 1 lb) of LN2 is required for each second of operation.

Figure 2:
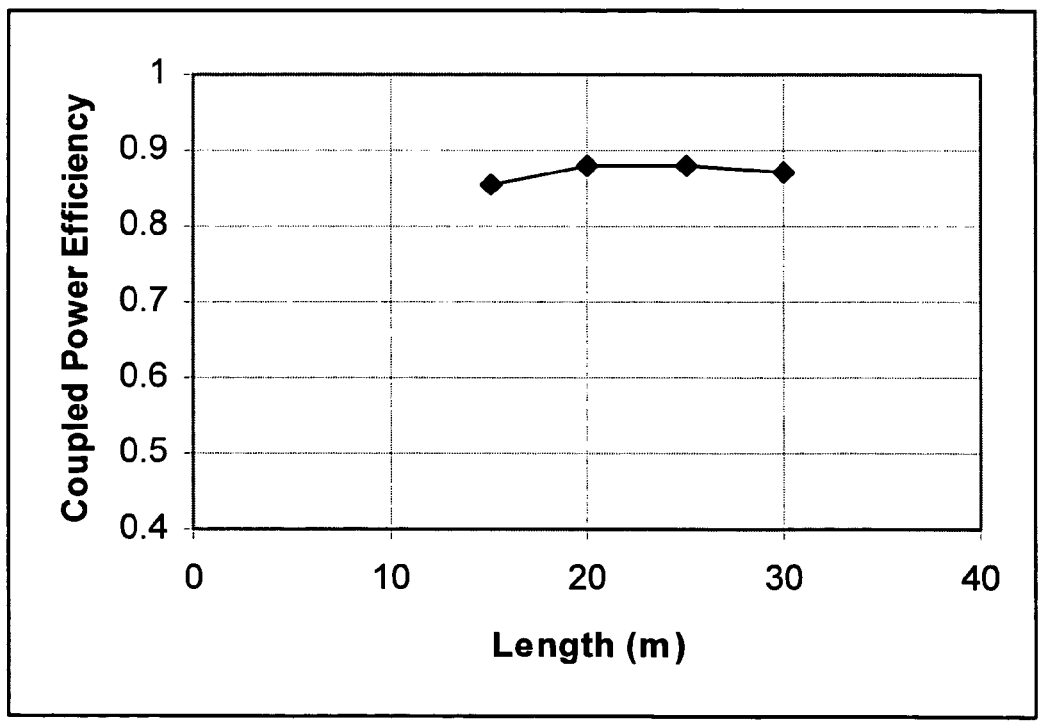
FIG. 2 is a graph similar to FIG. 1, but showing the optimization of an erbium doped fiber laser of a particular doping level, but where the measurements are made at liquid nitrogen temperature.

In accordance with another embodiment of the invention, a cryogenically cooled erbium (Er) doped fiber laser is used to produce a highly efficient laser system, with coupled power efficiencies as high as 90% or more. Erbium doped fiber amplifiers have been used extensively in telecommunications applications, and when pumped at about 1480 nm at room temperature, can achieve high efficiency at low powers. However, with double-clad fiber amplifiers the pump absorption is too low to make an efficient laser, because the Er concentration is limited due to competing upconversion and other quenching processes In addition, diode pumps near 1500 nm have fairly low efficiency. Therefore, much of the previous work in this area has focused on Yb codoping with 975 nm pumping to improve efficiency, which has resulted in optical efficiencies of about 40% at best. Simulations of various doping levels for a room temperature dual clad Er amplifier pumped at 1480 nm are shown in FIG. 1. By selection of fiber length at each doping level, the efficiency is optimized but does not exceed 56% for any doping level. However, if one operates at 77° K., as depicted for a selected doping level in FIG. 2, one can pump at the peak of the absorption at 1530 nm and achieve larger gain in shorter fiber lengths. As a result, one can achieve nearly ideal extraction efficiency approaching 90%, using a fiber length of around 20 m, as compared with the approximately 40 m lengths needed for optimization at room temperature.

Figure 3:
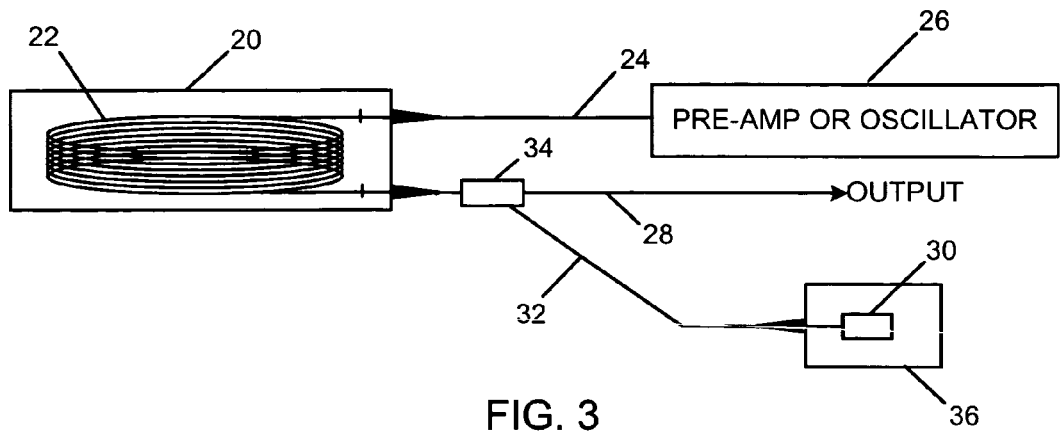
FIG. 3 is a block diagram depicting a cryogenic laser system in accordance with the invention, with a single fiber laser amplifier.

Fiber laser systems have the advantage that most or all of the optical path is confined to fiber, and therefore a cryogenic system can be built without the use of an optical Dewar enclosure (a cryogenic chamber with an optical window). Instead, as shown in FIG. 3, one requires only a vessel 20 that holds a cryogen and a doped amplifier fiber 22. This fiber 22 is spliced to a section of undoped fiber 24, which does not have any significant heat load and is fed through a wall of the vessel 20. The undoped fiber 24 couples output from a laser preamplifier or oscillator, indicated at 26. Another section of undoped fiber 28 is spliced to the output end of the amplifier fiber 22, extends through a wall of the vessel 20 and provides an output path from the amplifier fiber 22. The system further includes pump diodes 30, which must be immersed or in contact with a thermal sink of the appropriate cryogenic temperature. The diodes 30 can be directly coupled to another section of undoped fiber 32 that transmits pump power into the doped fiber amplifier 22, through a pump coupler 34. The diodes 30 may be cryogenically cooled in a separate cryogenic vessel 36, or may reside and be cooled in the same vessel 20 as the fiber amplifier 22.

Finally, for very high power applications one desires to combine the output of many fiber amplifiers, three of which are shown by way of illustration in FIG. 3. Various methods can be used for combining the multiple outputs, such as coherently combining, as described, for example in application Ser. No. 10/801,902, filed Mar. 14, 2004, entitled "Laser Source Comprising Amplifier and Adaptive Wavefront Driver," assigned to the same assignee as the present invention, or interferometrically combining, as described, for example in application Ser. No. 11/256,282 filed Oct. 19, 2005, entitled "Interferometric Beam Combination," also assigned to the same assignee as the present invention. In these and other approaches, the combined output beams from many fibers must be incident on one or more large aperture optics. For example, in spectrally combining beams this optic may be a diffraction grating. In coherent combining, a full aperture beam sampler is required. In any of these approaches, there is generally a significant concern about heating and thermal distortion of the full aperture optics, and the resultant degradation of the high power beam quality. If the final optic is used in reflection, i.e., a mirror, the concern is nonuniform expansion of the optic. If used in transmission, i.e., a lens, the concern is changes of the index of refraction of the optic. In all these cases, the use of cryogenic cooling of the large optics can have a significant benefit. In particular, a number of crystalline materials, such as sapphire, quartz, silicon, germanium, and so forth, have much larger thermal conductivity at cryogenic temperature, and some materials may have small or near vanishing expansion coefficients and/or coefficients of change in refractive index with temperature. Therefore, it can be very advantageous to apply the cryogenic cooling capability to reduce the temperature of the beam combining optics and thereby increase the beam quality of a very high power system.

Figure 4:
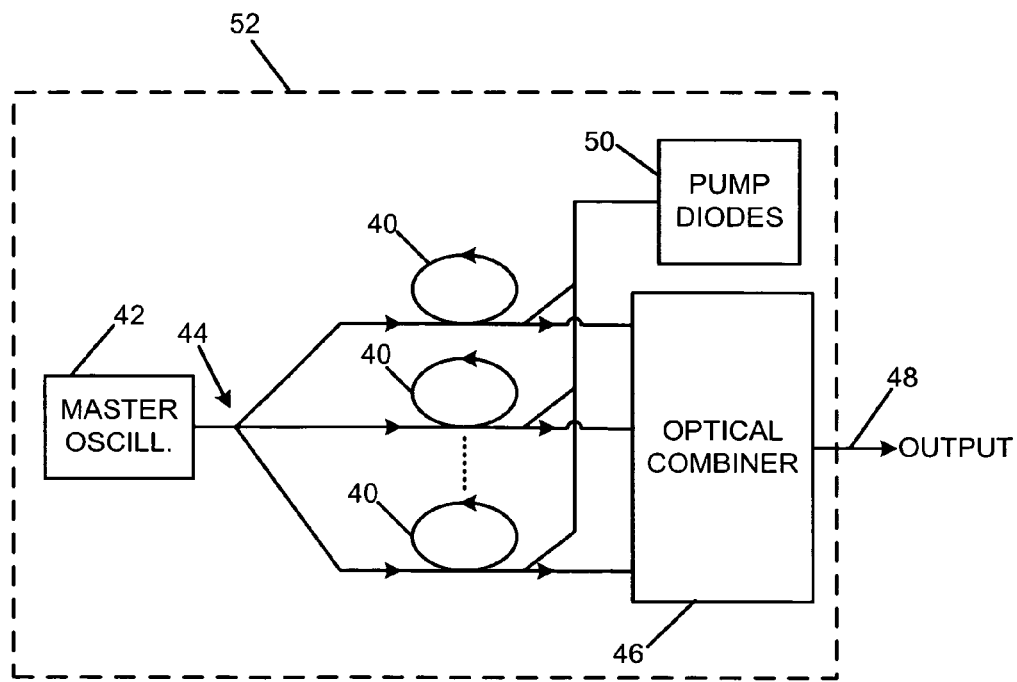
FIG. 4 is a block diagram depicting a cryogenic laser system in accordance with the invention, with multiple fiber laser amplifiers.

FIG. 4 depicts in diagrammatic form a laser system in accordance with the invention in which multiple beams from multiple fiber lasers 40 are combined to form a single composite output beam. The system includes a master oscillator 42 and a splitter 44 that couples the optical signal from the master oscillator into each of the fiber lasers 40. Outputs from the multiple fiber lasers 40 are combined in an optical combiner 46, which, as noted above, may take any of various forms. The optical combiner 46 produces a single output beam as indicated at 48. Pump diodes 50 provide pumping power that is coupled to each of the fiber lasers 40. This configuration also typically includes some form of phase control of the individual outputs of the fiber lasers 40, to ensure phase coherency when they are combined. Since this aspect of the multi-fiber laser system plays no part in the present invention, it has been omitted from the drawing for simplicity. In accordance with the invention, either a single cryogenic vessel 52 encloses the entire system, or separate vessels may be used to contain the fiber lasers 40, the pump diodes 50 and the final output optical element in the optical combiner 46.

Although the cryogenic cooling medium may be liquefied nitrogen or the like, some applications of the invention may utilize cooling provided by a different liquefied gas, such as methane or ammonia, for example, with a higher boiling point than that liquid nitrogen. The selection of a cooling medium will be dictated by the degree of cooling needed to achieve desired levels of output power and optical efficiency.

It will be appreciated from the foregoing that the present invention represents a significant advance in the field of high power fiber lasers. In particular, cooling a fiber laser, or multiple fiber lasers, to cryogenic temperatures results in a dramatic improvement in optical efficiency. Similar cooling of pump diodes and, in the case of combinations of multiple fiber lasers, output optics, results in further improvements. It will also be appreciated that, although specific embodiments of the invention have been described in detail for purposes of illustration, various modifications may be made without departing from the spirit and scope of the invention. Accordingly, the invention should not be limited except as by the appended claims.

The invention claimed is:

1. A high power cryogenic fiber laser system capable of operation at high efficiency levels, the system comprising:
    a plurality of fiber laser amplifiers;
    a master oscillator for generating an input optical signal at a desired wavelength;
    means for coupling the input optical signal to the plurality of fiber laser amplifiers;
    a plurality of laser pumps;
    means for coupling power from the laser pumps into the plurality of fiber laser amplifiers;
    means for cryogenically cooling the plurality of fiber laser amplifiers, resulting in enhanced optical slope efficiency; and
    means for optically combining the outputs of the plurality of fiber laser amplifiers, to produce a single coherent optical output.

2. A high power cryogenic fiber laser system as defined in claim 1, wherein each of the plurality of fiber laser amplifiers comprises a thulium doped fiber; and
    the laser system produces output at an eye-safe wavelength, with a slope efficiency of approximately 80%.

3. A high power cryogenic fiber laser system as defined in claim 1, wherein:
    each of the plurality of fiber laser amplifiers comprises an erbium doped fiber; and
    the laser system produces output with a slope efficiency of approximately 90%.

4. A high power cryogenic fiber laser system as defined in claim 1, and further comprising:
    means for cryogenically cooling the plurality of laser pumps.

5. A high power cryogenic fiber laser system as defined in claim 1, and further comprising:
    means for cryogenically cooling the means for optically combining the outputs of the plurality of fiber laser amplifiers.

6. A high power cryogenic fiber laser system as defined in claim 1, wherein:
    the means for cryogenically cooling comprises a cryogenic vessel containing liquid nitrogen.

7. A high power cryogenic fiber laser system as defined in claim 1, wherein:
    the means for cryogenically cooling comprises a cryogenic vessel containing a liquefied gas selected from the group consisting of nitrogen, methane, and ammonia.

8. A high power cryogenic fiber laser system as defined in claim 1, wherein the plurality laser pumps comprises a plurality of laser pump diodes.

9. A method for generating a high power laser beam from a cryogenic fiber laser system capable of operation at high efficiency levels, the method comprising:
    providing a plurality of fiber laser amplifiers;
    generating in a master oscillator an input optical signal at a desired wavelength;
    coupling the input optical signal to the plurality of fiber laser amplifiers;
    powering a plurality of laser pumps;
    coupling power from the laser pumps into the plurality of fiber laser amplifiers;
    cryogenically cooling the plurality of fiber laser amplifiers, resulting in enhanced optical slope efficiency; and
    optically combining the outputs of the plurality of fiber laser amplifiers, to produce a single coherent optical output.

10. A method as defined in claim 9, wherein:
    each of the plurality of fiber laser amplifiers comprises a thulium doped fiber; and
    the laser system produces output at an eye-safe wavelength, with a slope efficiency of approximately 80%.

11. A method as defined in claim 9, wherein:
    each of the plurality of fiber laser amplifiers comprises an erbium doped fiber; and
    the laser system produces output with a slope efficiency of approximately 90%.

12. A method as defined in claim 9, and further comprising:
    cryogenically cooling the plurality of laser pumps.

13. A method as defined in claim 9, wherein the step of optically combining comprises cryogenically cooling at least one optical element used for combining the outputs of the plurality of fiber laser amplifiers.

14. A method as defined in claim 9, wherein:
the step of cryogenically cooling comprises enclosing the fiber laser amplifiers in a cryogenic vessel containing liquid nitrogen.

15. A method as defined in claim 9, wherein:
the step of cryogenically cooling comprises enclosing the fiber laser amplifiers in a cryogenic vessel containing a liquefied gas selected from the group comprising of nitrogen, air, methane, carbon tetrafluoride, and ammonia.

* * * * *